METHOD OF MANUFACTURING SEMICONDUCTOR DEVICES

Filed June 16, 1967

INVENTOR.
THOMAS E. NORBY
BY Walter S. Zebrowski
ATTORNEY

United States Patent Office 3,486,951

Patented Dec. 30, 1969

3,486,951

METHOD OF MANUFACTURING SEMICONDUCTOR DEVICES

Thomas E. Norby, Raleigh, N.C., assignor to Corning Glass Works, Corning, N.Y., a corporation of New York Filed June 16, 1967, Ser. No. 646,604
Int. Cl. H01l 7/04
U.S. Cl. 148—188 25 Claims

ABSTRACT OF THE DISCLOSURE

A method for diffusing an impurity into a semiconductor material. A semiconductor wafer is subjected at low temperature to a spray of a solution of an impurity in a volatile vehicle in such a manner that a major portion of the vehicle is volatilized before it reaches the wafer whereby the surface of the wafer becomes substantially uniformly coated with minute spray particles of the impurity. The coated wafer is thereafter heated to diffuse the impurity thereinto.

BACKGROUND OF THE INVENTION

To form p-n junctions in the manufacture of semiconductor devices, it is necessary to introduce impurities into the semiconductive material. This is usually accomplished by diffusion. According to the prior art, it has been the practice to expose an etched surface of the semiconductive material, at an elevated temperature, to a vapor which included the impurity to be diffused. For example, in the formation of an n-type layer in p-type silicon, such materials as $PH_3$, $P_2O_5$, $POCl_3$, and $PCl_3$ have been introduced into a furnace as the material containing the phosphorous impurity to be diffused. Heretofore, care has been exercised to eliminate water vapor from the furnace to prevent the formation of phosphoric acid through combination with the impurities, which acid has been considered detrimental in causing unwanted pitting, etching, and the like of the silicon material. In addition, such accidental formation of phosphoric acid would result in the collection of the acid in the form of drops or beads on the surface of the silicon resulting in non-uniform diffusion.

As another exmple, in the formation of a p-type layer in an n-type silicon, such materials as $BBr_3$ and $B_2H_6$ have been introduced into a furnace as the material containing the boron impurity to be diffused.

It has also sometimes been desirable to first predeposit the impurity upon the semiconductor surface which will require a first heating to a temperature somewhat lower than the diffusion temperature for predeposition and thereafter a second heating for diffusion. In addition if one would desire to have various junction depths in the surface, more than one diffusion operation would be required. That is, for each junction depth one would go through the process of preparing the surface of the semiconductor material and thereafter diffusing the impurities into it. Such processes subject the semiconductor material to repeated high temperatures and alter the characteristics of the semiconductor material, particularly by shorting the carrier life and also by degenerating the physical properties of the semiconductor material.

Summary of the invention

The objects of the present invention are to provide an economic low temperature method for predepositing impurities upon the surface of a material for diffusion of the impurity into the material which overcomes the heretofore noted disadvantages, as well as provides for uniform impurity diffusion, and prevents the alteration of the characteristics of the material by maintaining its carrier life and by preventing the degeneration of the physical properties of the material which is brought about by reducing the need for subjecting the material to repeated high temperatures.

Broadly, according to the present invention, an impurity or dopant is diffused into the surface of a semiconductor wafer by first cleaning the wafer surface, then subjecting the wafer at low temperature to a fine spray of a solution of an impurity and a volatile vehicle in such manner that most of said vehicle volatilizes before it reaches the wafer surface, whereby the surface becomes substantially uniformly coated with minute spray particles of the impurity, and thereafter heating the wafer to a temperature sufficient to diffuse the impurity into the surface of the wafer.

Additional objects, features, and advantages of the present invention will become apparent, to those skilled in the art, from the following detailed description and the attached drawing, on which, by way of example, only the preferred embodiment of this invention is illustrated.

Detailed description

Figure 1:
FIGURES 1 through 5 and 7 are cross sectional views of a semiconductor body being processed in accordance with one embodiment of the present invention.

In accordance with one embodiment of this invention, a suitable p-type silicon substrate 10 is illustrated in FIGURE 1. The substrate material may be prepared by any techniques well known in the art for obtaining single crystal or mono-crystalline bodies of silicon. The surface of the substrate must be prepared by suitable polishing, however, such polished substrate material may be commercially purchased. Polishing of the surface may be accomplished by mechanical means such as lapping or the like, or by chemical means such as etching, as is well understood in the art. The polishing of the substrate material does not form part of the present invention.

After a suitably polished substrate material is obtained, the surfaces are cleaned, to remove any foreign matter or oxide film present, by immersion into a chromic acid bath followed by an etch in hydrofluoric acid. Other cleaning means known in the art may also be used.

Figure 2:
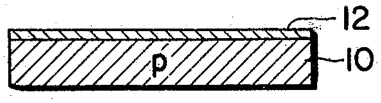
Figure 3:
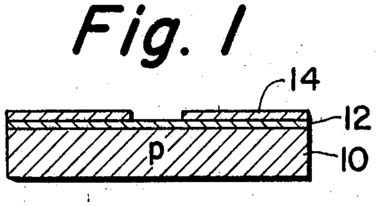

An oxide layer 12 is thereafter grown on the surface of wafer 10 as is illustrated in FIGURE 2. Such an oxide layer may be grown thermally or by low temperature means well known in the art. A mask 14 is then formed on oxide layer 12 which covers the entire surface of the substrate except that portion into which it is desired to diffuse the impurity as shown in FIGURE 3. The masking material of mask 14 may be any material not reactive with the substrate material or the oxide layer thereon and which will protect the masked oxide layer during formation of a window therein as hereinafter described. A suitable masking material is a photo-resist material, such as that commercially available under the name of KPR. With such a masking material, the mask is formed employing photolithographic techniques. According to such techniques, a layer of the photo-resist is applied to the oxide and is then exposed to light through a photographic negative or the like which hardens the exposed portions of the resist. The portions which have not been exposed to the light are washed out or otherwise removed. Obviously other materials may be used, and the use of such materials is well known in the semiconductor art for the selective masking of semiconductor substrate surfaces.

Figure 4:
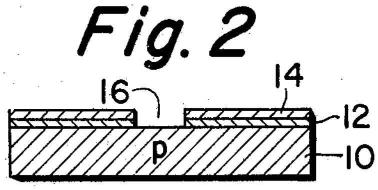

A window 16 is then formed, as illustrated in FIGURE 4, in the oxide layer by etching it through the opening in mask 14 with a suitable etch, such as for example a dilute solution of hydrofluoric acid as in the case of silicon dioxide. The surface of the substrate material is thereby exposed in preparation for diffusion thereinto of a desired impurity.

Figure 5:
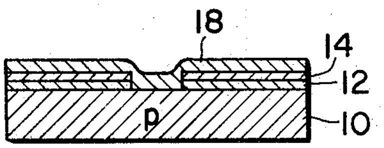
Figure 6:
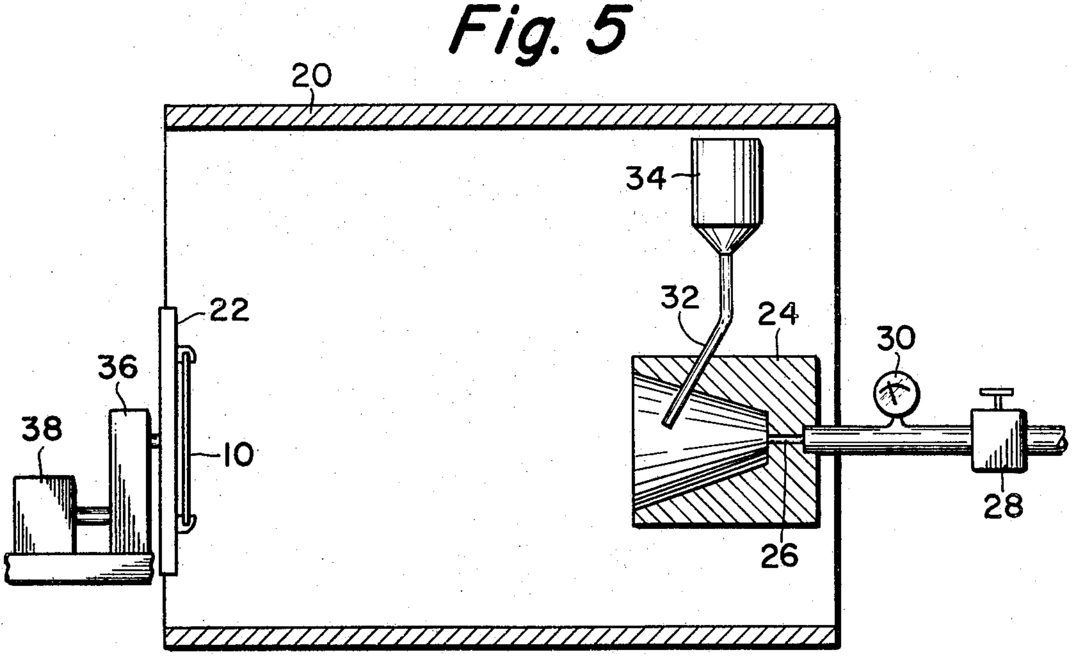
FIGURE 6 is a side elevation, partly in cross section, of an apparatus by means of which an impurity may be applied to the surface of a semiconductor body in accordance with the present invention.

A layer 18 of the impurity to be diffused into the substrate is applied to the surface thereof at a relatively low temperature, as illustrated in FIGURE 5. The means for applying a uniform film of the impurity to the substrate surface at low temperature is illustrated in FIGURE 6. A suitable chamber 20 is provided and at one end thereof, a semiconductor substrate 10 is mounted in a suitable holder or support structure 22. A nozzle 24 is disposed at the other end of the chamber. One end of the nozzle has an orifice 26 to which is connected a suitable source of gas pressure, not shown. The flow of gas through orifice 26 is controlled by means of pressure regulator 28 and pressure gauge 30.

The impurity material is introduced into nozzle 24 by means of tube 32 which is connected to a suitable supply container 34 containing a supply of impurity material and vehicle. For the formation of an n-type layer within a p-type silicon semiconductor material, high purity orthophosphoric acid may be used. Any phosphorous compound that is soluble in a volatile vehicle and does not contain other elements which would interfere with the diffusion or would themselves diffuse into the substrate are suitable for the present purposes. Examples of such suitable impurity materials are $P_4$ and $P_2O_3$. The vehicle within which the impurity is introduced into the nozzle may be any highly volatile material such as methyl alcohol, ethyl alcohol, propyl alcohol, ether, acetone, or the like. It has been found that by introducing the impurity in a highly volatile vehicle into the nozzle and by directing a gas stream from orifice 26 against the solution flowing from tube 32, the vehicle and impurity are caused to be dispersed into finely divided spray particles. Such dispersion and spraying is accomplished at substantially ambient room temperature. The size of the particles are at least in part controlled by the velocity of the gas stream emitting from orifice 26 as well as the type of gas used. As the vehicle and impurity is dispersed into minute spray particles, it is carried along through chamber 20 wherein substantially all of the vehicle is vaporized and minute particles of the impurity are caused to impinge upon the exposed surface of substrate 10. The gas, vaporized vehicle, and excess spray particles of the impurity are simply vented around the substrate support structure 22. The amount of spray particles of impurity material reaching the surface of substrate 10 depends at least in part upon the concentration of the impurity material in the solution being dispersed, as well as the gas pressure, and distance between nozzle 24 and the exposed surface of substrate 10.

With ideal nozzle characteristics and solution dispersement, a uniform layer of impurity material may be deposited on the exposed surface of substrate 10. However, such ideal conditions are ordinarily very difficult to achieve, therefore, substrate 10 is mounted in support structure 22 which is connected to a drive mechanism 36 that in turn is operated by motor 38. Drive mechanism 36 causes substrate 10 to oscillate, rotate, or translate in such a manner that the exposed surface of substrate 10 is moved through various positions at the end of chamber 20. In such a manner, a uniform coating of impurity may be deposited on the exposed surface of substrate 10 even though the nozzle characteristics are not ideal.

It should be understood that although this invention has been described with the nozzle being held stationary and the substrate being put into motion to facilitate application of a uniform film of impurity material thereto, this invention also contemplates putting the nozzle in motion while the substrate is stationary and also contemplates putting both the nozzle and substrate in motion. As is understood, the same result can be achieved from any such variation.

Figure 7:
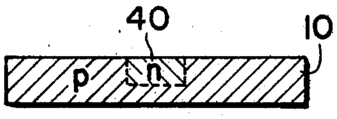

After a suitable layer of impurity material is deposited upon the surfaces of substrate 10, the substrate is placed into a high temperature oven or diffusion furnace and heated to the diffusing temperature of the impurity material, as is readily understood by one familiar with the art, whereupon the impurity is caused to diffuse into the surface of substrate 10 forming an n-type layer 40 therewithin, as is illustrated in FIGURE 7. Temperatures of at least 1000° C. are required for diffusion of phosphorous into p-type silicon. At diffusion temperatures the mask is volatilized while any oxide grown thereon may be removed as heretofore described.

It should be noted that by applying the impurity to a substrate by means of a vehicle, it is possible to accurately control the quantity of the impurity applied since usually only very small amounts are necessary and the vehicle is a diluent. Furthermore, the vehicle permits impurity uniformity and repeatability because it so greatly dilutes the impurity.

In accordance with another embodiment of this invention a p-type layer may be formed in an n-type substrate. For the formation of a p-type layer within an n-type silicon semiconductor material, high purity boric acid may be used. Other suitable p-type impurity materials are boron anhydride, and methyl borate.

Figure 8:
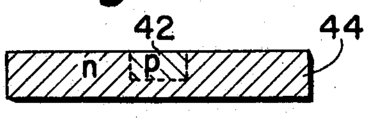
FIGURE 8 is a cross section view of a semiconductor body processed in accordance with another embodiment of the present invention.

After a suitable layer of p-type impurity is deposited upon the surface of the substrate, it is placed into an oven heated to a temperature of at least 1000° C., which temperature is required for practical diffusion of boron into n-type silicon. In FIGURE 8 is shown a p-type layer 42 formed within an n-type silicon substrate 44.

To illustrate the invention and the manner in which it may be practiced, the following examples are provided.

Example I

A polished, p-type, 10–14 ohm-cm., single crystal silicon wafer having a diameter of about 1 inch and a thickness of 7 to 8 mils was provided. A solution of 0.00001 gram of 85% by weight orthophosphoric acid in one cc. of methyl alcohol was prepared and disposed in container 34 of an apparatus such as is shown in FIGURE 6. Orifice 26 was connected to a suitable source of nitrogen.

The semiconductor wafer was suitable cleaned by disposing it in a hot chromic acid bath which was formed by preparing a saturated solution of chromium trioxide in sulfuric acid. Thereafter, the wafer was etched in a 48% by weight hydrofluoric acid to remove any surface oxide film. This was followed by rinsing in deionized water. Thereafter the wafer was mounted in support structure 22 such that one surface thereof was exposed to nozzle 24. The wafer was set in motion by means of drive mechanism 36 which caused it to oscillate in substantially a planar manner. Nitrogen under a pressure of 2.5 p.s.i. was emitted from orifice 26 and one milliliter of the solution from tube 32 was dispensed in about one minute. The surface of substrate 10 was maintained approximately 12 inches from tube 32. As the solution emitted from tube 32, it was broken up into fine spray particles and substantially all of the methyl alcohol vehicle was volatilized before reaching the exposed surface of the wafer. This dispersion and spraying was performed at room temperature. After one minute elapsed a very fine, uniform deposit of phosphorus containing material was formed on the exposed surface of the wafer without any beading being observed.

The wafer was removed from the support structure and placed in a furnace or oven maintained at a temperature of 1200° C. for one hour.

It was found that an n-type layer having impurity concentration suitable for collector applications was formed.

The junction depth formed was approximately 2 to 3 microns with a voltage to current ratio (V/I) being approximately 20, as measured with a four point probe.

Example II

An apparatus, gas, and wafer such as that described in Example I is used, and the wafer is cleaned as described therein. A solution of 0.0012 gram of 85% by weight of orthophosphoric acid and one cc. of methyl alcohol is prepared and disposed in container 30. With nitrogen pressure at 8 p.s.i., one milliliter of the solution is dispersed into fine spray particles in one to two minutes. As in Example I, the alcohol substantially vaporizes before the particles reach the wafer mounted in the support structure. The film of phosphorous containing material deposited on the wafer is very fine and uniform. The wafer is removed from the support structure and placed in an oven at 1200° C. for one hour. An n-type layer is formed in the wafer having a depth of 2 to 3 microns with V/I being about 5.

Example III

A semiconductor wafer of the type described in Example I was prepared as described therein and mounted in a support structure of an apparatus as also described therein. A solution of 0.0330 gram of orthophosphoric acid per cc. of methyl alcohol was prepared and disposed in container 30. Nitrogen having a pressure of approximately 2½ p.s.i. was emitted from orifice 22. The solution was caused to disperse into fine spray particles with the methyl alcohol volatilizing as heretofore described. A very fine, uniform layer of phosphorous containing material was deposited on the exposed surface of the semiconductor wafer. The wafer was removed from the support structure and placed into an oven at 1100° C. for five minutes. A shallow n-type layer of about 0.3 micron was formed in wafer 10. The resulting device had a V/I of approximately 2, as measured with a four point probe.

Example IV

A polished, n-type, 4–4.5 ohm cm., single crystal silicon wafer having a diameter of about one inch and a thickness of about 7 to 8 mils was provided. A solution of 0.004 gram of boric acid per one cc. of methyl alcohol was prepared and disposed in container 34 of an apparatus such as is shown in FIGURE 6. Orifice 26 was connected to a suitable source of dry nitrogen. The semiconductor wafer was suitably cleansed by disposing it in a hot chromic acid bath which was formed by preparing a saturated solution of chromium trioxide in sulfuric acid. Thereafter, the wafer was etched in a 48% by weight hydrofluoric acid to remove any surface oxide film. This was followed by rinsing in deionized water. Thereafter the wafer was mounted in support structure 22 such that one surface thereof was exposed to nozzle 24. The wafer was set in motion by means of drive mechanism 36 which caused it to oscillate in substantially a planar manner. Dry nitrogen under a pressure of 6 p.s.i. was emitted from orifice 26 and one milliliter of the solution from tube 32 was dispensed in about 2 minutes. The surface of the substrate was maintained approximately 12 inches from tube 32. As the solution emitted from tube 32, it was broken up into fine spray particles and substantially all of the methyl alcohol vehicle was volatilized before reaching the exposed surface of the wafer. This dispersion and spraying was performed at room temperature. After about one minute elapsed, a very fine, uniform deposit of boron containing material was formed on the exposed surface of the wafer.

The semiconductor wafer was removed from the support structure and placed in a furnace maintained at a temperature of about 1200° C. for 15 minutes. Oxygen at 20 cc. per minute and nitrogen at 1330 cc. per minute was flowed through the furnace.

The junction depth formed was approximately 2 microns with a voltage to current ratio (V/I) of approximately 20, as measured with a four point probe.

Example V

With the method described in Example IV but substituting methyl borate for boric acid, a junction was formed having a V/I of approximately 40.

Example VI

With the method described in Example IV but substituting boron anhydride for boric acid, a junction was formed having a V/I of approximately 5.

Although the present invention has been described with respect to specific details of certain embodiments thereof, it is not intended that such details be limitations upon the scope of the invention except insofar as set forth in the following claims.

I claim:

1. A method of diffusing phosphorous into the surface of a p-type silicon substrate comprising the steps of subjecting said substrate at relatively low temperature to a fine spray of a solution of orthophopsphoric acid and a volatile vehicle in such manner that substantially all of said vehicle volatilizes before it reaches the substrate surface whereby the surface becomes substantially uniformly coated with minute spray particles of phosphorous containing material, and thereafter heating said substrate to a temperature sufficient to diffuse the phosphorous contained in said material into the surface of said silicon.

2. The method of claim 1 further comprising the step of cleansing the substrate surface prior to subjecting it to said fine spray.

3. The method of claim 1 wherein said volatile vehicle is selected from the group consisting of methyl alcohol, ethyl alcohol, propyl alcohol, ether, and acetone.

4. The method of claim 1 further comprising the step of causing said substrate to move about in a substantially planar manner while being subjected to said fine spray.

5. The method of claim 1 further comprising the step of causing the means for providing said spray to move about while said substrate is subjected to said spray.

6. The method of claim 1 wherein said substrate is maintained in an atmosphere of substantially nitrogen while being subjected to said fine spray.

7. The method of claim 1 wherein said substrate is heated to a temperature of at least 1000° C.

8. A method of diffusing an impurity into the surface of a semiconductor substrate comprising the steps of subjecting said substrate to a fine spray of a solution of said impurity and a volatile vehicle in such manner that most of said vehicle volatilizes before it reaches the substrate surface whereby the surface becomes substantially uniformly coated with minute spray particles containing said impurity, and thereafter heating said substrate to a temperature sufficient to diffuse said impurity into the surface of said substrate.

9. The method of claim 8 wherein said semiconductor wafer comprises single crystal silicon.

10. The method of claim 9 wherein said impurity is phosphorous.

11. The method of claim 9 wherein said solution comprises orthophosphoric acid and methyl alcohol.

12. The method of claim 9 further comprising the step of cleansing said wafer by immersion in a hot chromic acid followed by immersion in hydrofluoric acid.

13. The method of claim 10 further comprising the step of maintaining said substrate in an atmosphere of nitrogen when it is subjected to said spray.

14. The method of claim 10 wherein said substrate is caused to move about in a substantially planar manner while being subjected to said fine spray.

15. The method of claim 10 wherein the means for providing said spray is caused to move about while said substrate is subjected to said spray.

16. The method of claim 10 wherein said substrate is heated to a temperature of at least 1000° C.

17. The method of forming a junction device comprising the steps of providing a substrate of single crystal silicon, cleansing said substrate by immersion in hot chromic acid, removing any oxide from the surface of said substrate by immersion in hydrofluoric acid, mounting said substrate so as to permit it to be moved about in a substantially planar manner, spraying a solution of phosphoric acid and methyl alcohol, volatilizing substantially all of said methyl alcohol from said sprayed solution, causing at least a portion of the remainder of said spray to impinge upon a surface of said substrate, and thereafter heating the sprayed substrate to a temperature of at least 1000° C.

18. A method of diffusing boron into the surface of an n-type silicon substrate comprising the steps of subjecting said substrate at relatively low temperature to a fine spray of a solution of boric acid and a volatile vehicle in such a manner that substantially all of said vehicle volatilizes before it reaches the substrate surface whereby the surface becomes substantially uniformly coated with minute spray particles of boron containing material, and thereafter, heating said substrate to a temperature sufficient to diffuse the boron contained in said material into the surface of said n-type silicon.

19. The method of claim 18 wherein said volatile vehicle is selected from the group consisting of methyl alcohol, ethyl alcohol, propyl alcohol, ether, and acetone.

20. The method of claim 18 further comprising the steps of causing said substrate to move about in a substantially planar manner while being subjected to said fine spray.

21. The method of claim 18 further comprising the step of causing the means for providing said spray to move about while said substrate is subjected to said spray.

22. The method of claim 18 further comprising the step of cleansing the substrate surface prior to subjecting it to said fine spray.

23. The method of claim 18 wherein said substrate is maintained in an atmosphere of substantially nitrogen while being subjected to said fine spray.

24. The method of claim 18 wherein said substrate is heated to a temperature of at least 1000° C.

25. The method of forming a junction device comprising the steps of providing a substrate of n-type single crystal silicon, cleansing said substrate by immersion in hot chromic acid, removing any oxide from the surface of said substrate by immersion in hydrofluoric acid, mounting said substrate so as to permit it to be moved about in a substantially planar manner, spraying a solution of boric acid and methyl alcohol, volatilizing substantially all of said methyl alcohol from said sprayed solution, causing at least a portion of the remainder of said spray to impinge upon a surface of said substrate, and thereafter heating the sprayed substrate to a temperature of at least 1000° C.

References Cited

UNITED STATES PATENTS

| | | | |
|---|---|---|---|
| 3,104,991 | 9/1963 | MacDonald | 148—188 |
| 3,148,084 | 9/1964 | Hill et al. | 117—104 |
| 3,354,005 | 11/1967 | Lepiane et al. | 148—188 |
| 3,383,236 | 5/1968 | Brindamour | 117—105.3 |

L. DEWAYNE RUTLEDGE, Primary Examiner

R. A. LESTER, Assistant Examiner

U.S. Cl. X.R.

148—186, 189; 252—62.3